US012717716B2

(12) United States Patent
Ranjan et al.

(10) Patent No.: US 12,717,716 B2
(45) Date of Patent: Aug. 25, 2026

(54) BUS REMAPPING DATA PROTECTION FOR VOLATILE MEMORIES

(71) Applicant: STMicroelectronics International N.V., Geneva (CH)

(72) Inventors: Om Ranjan, Greater Noida (IN); Vivek Kumar Sood, Lucknow (IN); Sankara Mallikarjuna Rao, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/967,072

(22) Filed: Dec. 3, 2024

(65) Prior Publication Data

US 2026/0154197 A1 Jun. 4, 2026

(51) Int. Cl.
*G06F 12/02* (2006.01)
*H03M 13/11* (2006.01)

(52) U.S. Cl.
CPC ..... *G06F 12/0284* (2013.01); *H03M 13/1157* (2013.01); *G06F 2212/1052* (2013.01)

(58) Field of Classification Search
CPC ........ G06F 12/0284; G06F 2212/1052; H03M 13/1157
See application file for complete search history.

(56) References Cited

U.S. PATENT DOCUMENTS 9,432,298 B1 8/2016 Smith
2006/0095703 A1* 5/2006 Ferraiolo ............ G06F 13/4239 711/170
2009/0187811 A1 7/2009 Eroz
2009/0204824 A1* 8/2009 Lin ......................... G06F 21/72 714/E11.041
2013/0268822 A1 10/2013 Manoochehri
2015/0364191 A1 12/2015 Muralimanohar
2020/0285538 A1* 9/2020 Kim .................... H03M 13/353
2022/0278694 A1 9/2022 Myung
(Continued)

OTHER PUBLICATIONS

Hur, Jae Young et al., "Adaptive Linear Address Map for Bank Interleaving in DRAMs," IEEE Access, vol. 4, 2016, DOI 10.1109/ACCESS.2019.2940351, vol. 7, Sep. 11, 2019, 13 pages.
(Continued)

*Primary Examiner* — Janice M. Girouard
(74) *Attorney, Agent, or Firm* — Slater Matsil, LLP

(57) ABSTRACT

According to an embodiment, a method for operating a memory system includes receiving data bits at a memory controller for storage in memory, remapping the data bits according to a predetermined scheme as they are transmitted from the controller to memory via a bus, storing the remapped bits in memory, reading the remapped bits from memory via the bus, and inverse remapping the bits to restore their original order as they are transmitted back to the controller. The remapping enhances fault tolerance by spatially separating related bits. The scheme may use techniques like multiplexing, cyclic shifting, or pseudo-random distribution. The remapping can be implemented through hardwired bus connections without adding clock cycles. The method improves resilience to multi-bit errors in wide-word volatile memories used in safety-critical applications, while maintaining compatibility with existing error detection methods.

20 Claims, 5 Drawing Sheets

(56) References Cited

U.S. PATENT DOCUMENTS

2025/0190172 A1* 6/2025 Leighton ................ G06F 7/535

OTHER PUBLICATIONS

Kan, Senwen et al., "Enhancing Embedded SRAM Security and Error Tolerance with Hardware CRC and Obfuscation," 2015 IEEE International Symposium on Defect and Fault Tolerance in VLSI and Nanotechnology Systems (DFTS), Oct. 12-14, 2015, pp. 119-122.

Neuberger, Gustavo et al., "A Multiple Bit Upset Tolerant SRAM Memory," Oct. 2003, ACM Transactions on Design Automation of Electronic Systems, vol. 8, Issue 4, 6 pages.

* cited by examiner

BUS REMAPPING DATA PROTECTION FOR VOLATILE MEMORIES

TECHNICAL FIELD

The present disclosure generally relates to electronic devices and, in particular embodiments, to remapping the bus for data protection in volatile memory.

BACKGROUND

Modern electronic systems often rely on complex system-on-chip (SoC) designs for safety-critical applications in automotive and industrial domains. These SoCs incorporate various functional components, including volatile memory for storing and retrieving data for real-time processing and decision-making in these safety-critical environments.

Safety standards, such as ISO 26262 for automotive applications, mandate a certain level of fault tolerance in different components of the SoC. The requirement extends to volatile memories, which can be particularly susceptible to failures due to various physical events. The events may include short circuits, open circuits, or radiation-induced state changes that can affect the stored data.

Traditionally, error correction codes (ECC) and parity checks have been employed to enhance the resilience of volatile memories against faults. These techniques can be combined with bit interleaving in the physical memory design to improve fault tolerance. Bit interleaving involves spreading related bits across different physical locations within the memory array, reducing the likelihood of multiple related bits being affected by a single physical event.

Memory compilers used in SoC design can generate memories with different configurations, including data bus widths and internal array sizes. Sometimes, memories with short data widths, such as 8-bit or 16-bit, may have internal arrays of 256 bits or more. This configuration allows multiple words to be stored in a single row, facilitating bit interleaving across these words.

However, as applications demand higher performance and more considerable data handling capabilities, wide-word memories have become more prevalent. The wide-word memories may have data widths of 128 bits or more, potentially occupying the entire bit array in a single row. This configuration can present challenges for implementing traditional bit-interleaving techniques, as the memory compiler may not support physical bit-interleaving by default for these wide-word structures.

The increasing adoption of Advanced Driver Assistance Systems (ADAS) and other high-performance, safety-critical applications has led to a growing demand for wide-word memories in safety-related contexts. The trend has highlighted the need for effective fault tolerance strategies that can be applied to these wide-word memory structures while maintaining high performance and meeting safety requirements.

SUMMARY

Technical advantages are generally achieved by embodiments of this disclosure, which describe remapping the bus for data protection in volatile memory.

A first aspect relates to a method for operating a memory system. The method comprising receiving, at a memory controller, data bits for a word to be stored in a memory; remapping the data bits according to a predetermined remapping scheme as the data bits are transmitted from the memory controller to the memory via a bus; storing the remapped data bits in the memory; reading the remapped data bits from the memory via the bus; and inverse remapping the data bits according to an inverse of the predetermined remapping scheme, as the data bits are transmitted from the memory to the memory controller via the bus, to restore the original order of the data bits.

A second aspect relates to a memory system comprising a memory controller; a memory; and a bus coupling the memory controller to the memory, wherein the bus is configured to: remap data bits according to a predetermined remapping scheme as the data bits are transmitted from the memory controller to the memory, and inverse remap the data bits according to an inverse of the predetermined remapping scheme, as the data bits are transmitted from the memory to the memory controller, to restore the original order of the data bits.

A third aspect relates to a method for operating a memory system, the method comprising receiving, at a memory controller, data bits for a word to be stored in a memory; remapping, by the memory controller, the data bits according to a predetermined remapping scheme to create remapped data bits; generating, by the memory controller, parity bits based on the remapped data bits; storing the original, unremapped data bits in the memory; and storing the generated parity bits in the memory.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise. Various embodiments are illustrated in the accompanying drawing figures, where identical components and elements are identified by the same reference number, and repetitive descriptions are omitted for brevity.

Variations or modifications described in one of the embodiments may also apply to others. Further, various changes, substitutions, and alterations can be made herein without departing from the spirit and scope of this disclosure as defined by the appended claims.

While the inventive aspects are described primarily in the context of wide-word volatile memories in safety-critical automotive and industrial applications, it should also be appreciated that these inventive aspects may also apply to other types of memory systems and applications. In particular, aspects of this disclosure may similarly apply to non-volatile memories, embedded memory systems in various electronic devices, and data storage systems in other safety-sensitive domains such as aerospace, medical devices, or nuclear power control systems.

Aspects of the disclosure relate to improving fault tolerance in memory systems, particularly wide-word memories. The approach involves remapping bits within a memory word to enhance resilience against multi-bit errors.

In embodiments, a memory controller generates parity bits for storing data in memory. The controller then remaps data and parity bits before writing them to the memory array. The remapping process can spread dependent bits, including parity bits, across the memory word according to a predetermined pattern. The pattern may be designed to separate bits protected by the same parity bit by a specified distance within the word.

The remapping can be implemented through hardwired connections between the memory controller and the memory array. The implementation may allow for flexibility in choosing different interleaving depths or multiplexing factors, which can be selected based on technology sensitivity and design requirements.

One advantage of this approach is that it may be achieved without introducing additional timing overhead, which can benefit high-speed memory operations. The hardwired implementation may allow remapped bits to be written to and read from the memory array at speeds comparable to non-remapped configurations.

The proposed technique may benefit wide-word memories in safety-critical applications like automotive and industrial systems. It can provide enhanced error detection capabilities using parity-based methods, which may offer improved fault coverage in specific scenarios. These and additional features are further detailed below.

Figures 1, 2:
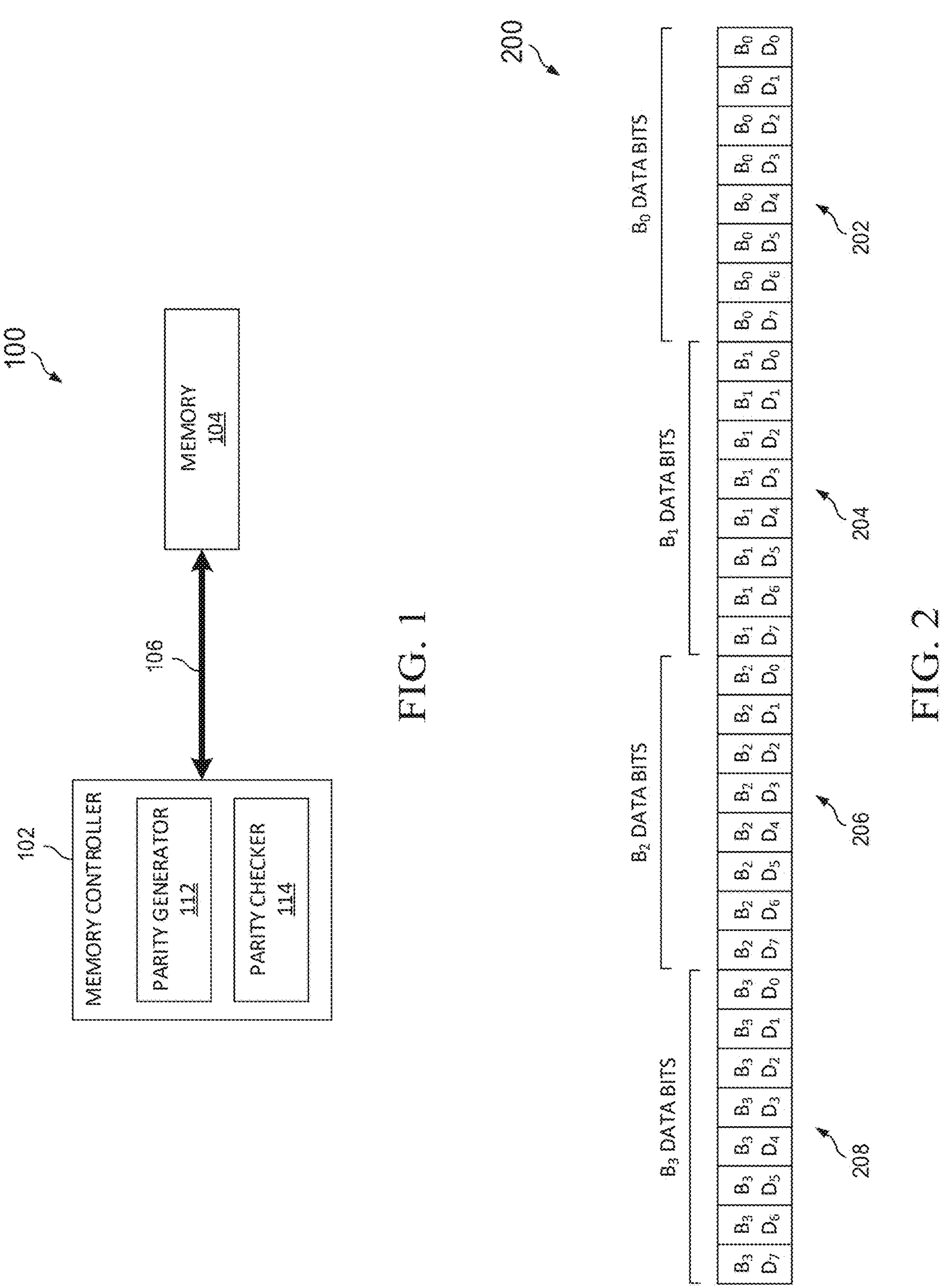
FIG. 1 is a simple block diagram of an embodiment memory system.
FIG. 2 is the arrangement of a word in a memory controller write bus before remapping occurs.

FIG. 1 illustrates a simple block diagram of an embodiment memory system 100. Memory system 100 includes a memory controller 102 coupled to a memory 104 via a bus 106, which may (or may not) be arranged as shown. Additional components not shown, such as input/output interfaces and other peripheral devices, may also be included.

In safety-critical applications, functional units must provide resilience against faults through detection or correction mechanisms. Volatile memories contribute to application failures due to faults resulting from physical events such as shorts, opens, or radiation-induced state flipping. These physical events can corrupt one bit, two bits, or even all bits in a word. Traditionally, parity and Error Correcting Codes (ECC) have been used to achieve the required resilience, often combined with bit interleaving in the physical memory design. The memory system 100 described herein provides an alternative approach to enhance fault tolerance, particularly for wide word memories where traditional methods may be less effective.

Memory controller 102 manages data transfer between memory 104 and other system components. It can include circuits for generating parity bits and checking parity. For example, memory controller 102 may contain a parity generator circuit 112 and a parity checker circuit 114.

In embodiments, memory 104 represents a volatile memory array designed for safety-critical applications. These applications include automotive systems, industrial control equipment, or aerospace technologies where data integrity is paramount. In embodiments, memory 104 is a wide word volatile memory array capable of storing data words of 128 bits or more. This large word size is particularly suited for high-performance, safety-critical systems rapidly processing significant amounts of data. Generally, memory 104 does not incorporate built-in bit interleaving capabilities. This characteristic can make it more susceptible to multi-bit errors, which the remapping technique implemented through bus 106 aims to mitigate.

In embodiments, the remapping process involves a multiplexing factor. The multiplexing factor determines the spacing between related bits in the remapped word. For example, a multiplexing factor of four means that bits originally adjacent in a byte are separated by three other bits in the remapped configuration.

The choice of multiplexing factor can be a design decision based on the technology sensitivity of the particular memory design and the desired level of fault tolerance. A higher multiplexing factor can be employed for larger word sizes, such as 128-bit or 256-bit words, further spreading related bits and enhancing fault tolerance. The flexibility to adjust the multiplexing factor allows the memory system 100 to be tailored to specific memory configurations and safety requirements without changing the underlying memory structure.

In embodiments, the selection of the multiplexing factor is tied to the technology sensitivity of the particular memory design. Different memory technologies exhibit varying levels of vulnerability to multi-bit errors caused by physical events such as radiation strikes. In more sensitive technologies, a higher multiplexing factor may be advantageous to provide protection against such events. A system designer can consider the known vulnerability patterns of the specific memory technology being used, such as its susceptibility to column-wise failures or its sensitivity to localized charge deposits. The remapping technique can be optimized by tailoring the multiplexing factor to these known patterns to provide the most effective protection against the most likely failure modes for a given memory technology. The approach balances fault tolerance and implementation complexity, ensuring the remapping provides sufficient protection without unnecessary overhead.

The design of memory 104 can be constrained by technological limitations inherent to large word memories, particularly in modules like Level 3 (L3) cache controllers and Double Data Rate (DDR) controllers. These constraints can affect memory size, data bus width, and the associated multiplexing factor, all of which can be influenced by the memory's physical form factor.

For memories with large word widths, existing memory options often have only a multiplexing factor of one or two. This limitation can be problematic because such a low multiplexing factor cannot achieve the required coverage for Automotive Safety Integrity Level D (ASIL-D) goals. Additionally, these large word memories can be sensitive to physical events that result in multi-bit errors, further complicating the challenge of meeting stringent safety requirements.

The remapping technique described in the present disclosure is particularly beneficial for modules such as L3 cache controllers and DDR memory controllers. As discussed above, these modules often require large memory word widths to support high-performance data processing. However, in many cases, the available memory options for these controllers have limited multiplexing factors, typically only one or two. The limitation can make achieving the required fault coverage challenging, especially for stringent safety standards like ASIL-D. By implementing the bus remapping technique proposed herein, these controllers can effectively increase their resilience against multi-bit errors without requiring changes to the underlying memory structure. The approach allows L3 cache and DDR controllers to maintain their high-speed operations while significantly enhancing their fault tolerance. It makes them more suitable for use in safety-critical systems such as advanced driver assistance systems (ADAS) or autonomous driving platforms.

In these scenarios, traditional Error Correcting Code (ECC) correction and parity checking methods often cannot provide sufficient coverage to meet the higher safety integrity levels required by applications targeting Automotive Safety Integrity Level C (ASIL-C) or D (ASIL-D). These are currently the most stringent safety levels in the automotive industry, demanding extremely high fault detection and correction capabilities.

Prior attempts to address the limitations of traditional error correction methods in large word memories have included various approaches. Some solutions rely on application-oriented software measures, but these are not globally applicable and may not meet the needs of diverse safety-critical systems. Other hardware-based solutions include storing ECC information in duplicate or in shadow memory, which can increase memory overhead and complexity. Additionally, some systems employ ECC with Multiple Error Detect capabilities, which can identify multiple errors but may still fall short in correction capabilities for wide word memories.

It's important to note the distinction between traditional bit-interleaving typically implemented by memory compilers and the remapping technique proposed in the present disclosure. While traditional bit-interleaving is often unavailable for wide-word memories due to compiler limitations, the proposed approach implements a form of logical interleaving through bus remapping. This technique effectively overcomes the limitations of physical bit-interleaving in scenarios where the memory compiler does not support it. Doing so extends the benefits of interleaving to wide-word memories, enhancing their fault tolerance without requiring changes to the underlying memory structure or compiler.

Memory 104 may or may not incorporate built-in bit interleaving capabilities. The absence of built-in bit interleaving can make memory 104 more susceptible to multi-bit errors. However, the remapping technique implemented through bus 106 can mitigate such vulnerabilities, making it advantageous to enhance fault tolerance without requiring changes to the memory structure itself.

While memory 104 may not necessarily have advanced error correction features built into its structure, its integration with the remapping technique provided by bus 106 and the error detection capabilities of memory controller 102 create a robust system for maintaining data integrity. This approach allows for using standard memory components while still meeting the stringent reliability requirements of safety-critical systems, including those targeting ASIL-C or ASIL-D compliance.

Bus 106 facilitates data transfer between the memory controller 102 and memory 104. In embodiments, bus 106 can carry both data and parity bits. The width of bus 106 may be larger than the data width to accommodate the additional parity bits. For example, in a system with 128-bit data words and 16 parity bits, bus 106 can be 144 bits wide.

In embodiments, a remapping technique to enhance fault tolerance is implemented through the wiring of bus 106. The process can involve reorganizing the data and parity bits during transfer between memory controller 102 and memory 104. The remapping spreads dependent bits (data bits protected by the same parity bit, along with their corresponding parity bits) across the word, increasing the distance between them. The approach can improve resilience against multi-bit errors caused by physical events like radiation-induced state flipping. This remapping technique can combine with the existing parity protection for memory, enhancing overall system reliability.

The bus components can be remapped using a single assign statement for each remapping at System-on-Chip (SoC) integration. This approach requires no changes to the existing Intellectual Property (IP) blocks, simplifying implementation and maintaining compatibility with existing designs.

When writing data to memory 104, the memory controller 102 generates parity bits for the data using the parity generator circuit 112. As the data and parity bits are transmitted over bus 106, they are automatically remapped according to a predetermined pattern that increases the distance between related bits. The remapped data is received and stored by memory 104.

When reading data from memory 104, the process is reversed. The remapped data and parity bits are sent over bus 106, where the wiring automatically applies an inverse remapping. Memory controller 102 receives the restored data and checks the parity through the parity checker circuit 114 to detect any errors that may have occurred while the data was stored in memory 104.

For example, consider a memory system with 128-bit data words and 16 parity bits, totaling 144 bits. When writing to memory 104, memory controller 102 generates the 16 parity bits for the 128-bit data word using parity generator circuit 112. The 144 bits (128 data+16 parity) are transmitted over bus 106.

The bus wiring remaps the bits during transmission according to a predetermined pattern. This pattern might spread bits originally adjacent in the 128-bit word to be 16 positions apart in the remapped 144-bit word. For example, bit 0 of the original data might be mapped to position 0, bit 1 to position 16, bit 2 to position 32, and so on, with parity bits interspersed at specific intervals. Memory 104 stores the remapped 144-bit word.

When reading, memory 104 sends the stored 144-bit word back over bus 106. The bus wiring automatically inverts the remapping, restoring the original bit order. Memory controller 102 receives the 128-bit data and 16 parity bits in their original configuration, allowing parity checker circuit 114 to verify data integrity.

If the parity checker circuit 114 detects discrepancies during the parity check, it generates a parity error signal. The error signal can indicate that one or more bits in the data word have been corrupted during storage or transmission. The memory controller 102 can then take appropriate action based on the error signal.

Depending on the system design and requirements, these actions may include requesting a re-transmission of the data, initiating error correction procedures if implemented, or notifying the system of a potential data integrity issue. Generating a parity error by the parity checker circuit 114 maintains data reliability in the memory system 100, particularly in applications where data integrity can be critical for system safety and operation.

The remapping technique enhances protection against multi-bit errors without changing memory controller 102 or memory 104 itself. It can be implemented using hardwired connections within bus 106, avoiding the need for additional logic gates and minimizing the impact on system timing. The specific remapping pattern can be tailored to the word size of memory 104 and the desired level of fault tolerance.

The remapping technique allows for flexible adjustment of the interleaving factor. In the case of a lower interleaving factor requirement for larger words, the number of parity bits (i.e., check bits) can be reduced without compromising coverage. For example, the system can use 1-bit per half-word (32-bits) instead of 1-bit per nibble or 1-bit per byte. The interleaving factor can be reduced, further reducing the number of check bits. The approach effectively reduces the memory width and, consequently, the chip area. Such optimization enhances the memory system's efficiency, particularly for wide word applications, and contributes to overall chip size reduction. This feature can be particularly advantageous in applications where minimizing chip area is crucial, such as in compact automotive or mobile systems.

Advantageously, the remapping technique implemented through bus 106 effectively mitigates the risk of single physical defects, particularly transient faults, from affecting multiple bits within a parity-protected group. By spreading dependent bits across the memory word, the likelihood of a localized event corrupting more than one bit in the same parity group is significantly reduced. The spreading of bits enhances the effectiveness of parity protection, making the memory system 100 more resilient to radiation-induced faults and other transient errors.

Further, the remapping technique offers flexibility in adjusting the multiplexing factor. The adaptability allows memory system 100 to be tailored to specific memory configurations and safety requirements. The multiplexing factor can be easily increased, particularly for larger word sizes, without requiring substantial changes to the overall system architecture. The scalability enables the memory system 100 to maintain optimal fault tolerance even as word sizes grow, which can be particularly beneficial for evolving high-performance computing applications in safety-critical domains. The adjustability of the multiplexing factor can also allow system designers to fine-tune the balance between fault tolerance and memory utilization, adapting to different technological sensitivities and design requirements across various applications.

While the remapping technique described herein is implemented through hardware-based bus wiring, a similar shuffling of information across the word width could be accomplished in software in some embodiments. However, such a software-based approach can be less efficient depending on the application. For example, software implementation can introduce additional processing overhead, potentially impacting system performance and latency.

The system can provide high integrity protection for wide word volatile memories without significant area overhead or performance impact. It can be particularly suitable for safety-critical applications in automotive, industrial, or aerospace domains where high fault coverage is desired.

While the present disclosure describes specific implementations of the bus remapping technique through bus 106, it should be understood that various modifications and alternative arrangements may be used without departing from the spirit and scope of the invention in other embodiments. The specific wiring or routing of the bus 106 may be implemented in different ways depending on the particular system requirements, technology constraints, or design preferences.

For example, the remapping could be implemented using configurable logic elements, programmable interconnects, or other flexible routing mechanisms. The exact implementation can vary based on factors such as the specific memory technology being used, the desired level of configurability, or the system's safety and performance requirements. The variations in bus implementation are considered to be within the scope of the present disclosure.

FIG. 2 illustrates the arrangement of a word 200 in a memory controller write bus before remapping occurs. Word 200 is a 32-bit word organized into four bytes (i.e., $B_0$, $B_1$, $B_2$, and $B_3$), each containing 8 bits (i.e., $D_0$ through $D_7$). The arrangement represents a typical word structure in computer memory systems, with the least significant byte (i.e., $B_0$) on the right and the most significant byte (i.e., $B_3$) on the left.

The bits within each byte are ordered from least significant (i.e., $D_0$) to most important (i.e., $D_7$), following standard digital logic conventions. For example, in each of the first byte $B_0$ 202, the second byte $B_1$ 204, the third byte $B_2$ 206, and the fourth byte $B_3$ 208, the first bit $D_0$ is the least significant bit, while the last bit $D_7$ is the most significant bit of that byte.

While FIG. 2 shows a 32-bit word, it is an example of the general principle that can be applied to larger word sizes. In practice, memory system 100 can handle larger words, such as 128-bit or 256-bit words, following a similar organizational pattern. The number of bytes and bits can scale accordingly, maintaining the least-to-most significant ordering both within bytes and across the entire word.

It's worth noting that this figure does not include parity bits. In a complete system, parity bits would typically be associated with each byte or with specific groupings of bits within the word. The number and placement of parity bits can vary depending on the error detection and correction scheme employed by memory system 100. For example, in some configurations, every third or fourth bit may be used as a parity bit, creating an interleaving distance within the data structure. The approach can effectively integrate the interleaving of the bus 106 into the parity generation and checking process rather than implementing interleaving between the memory controller 102 and the memory 104. Such an arrangement can enhance error detection and correction capabilities while optimizing available bandwidth.

Figures 3, 4:
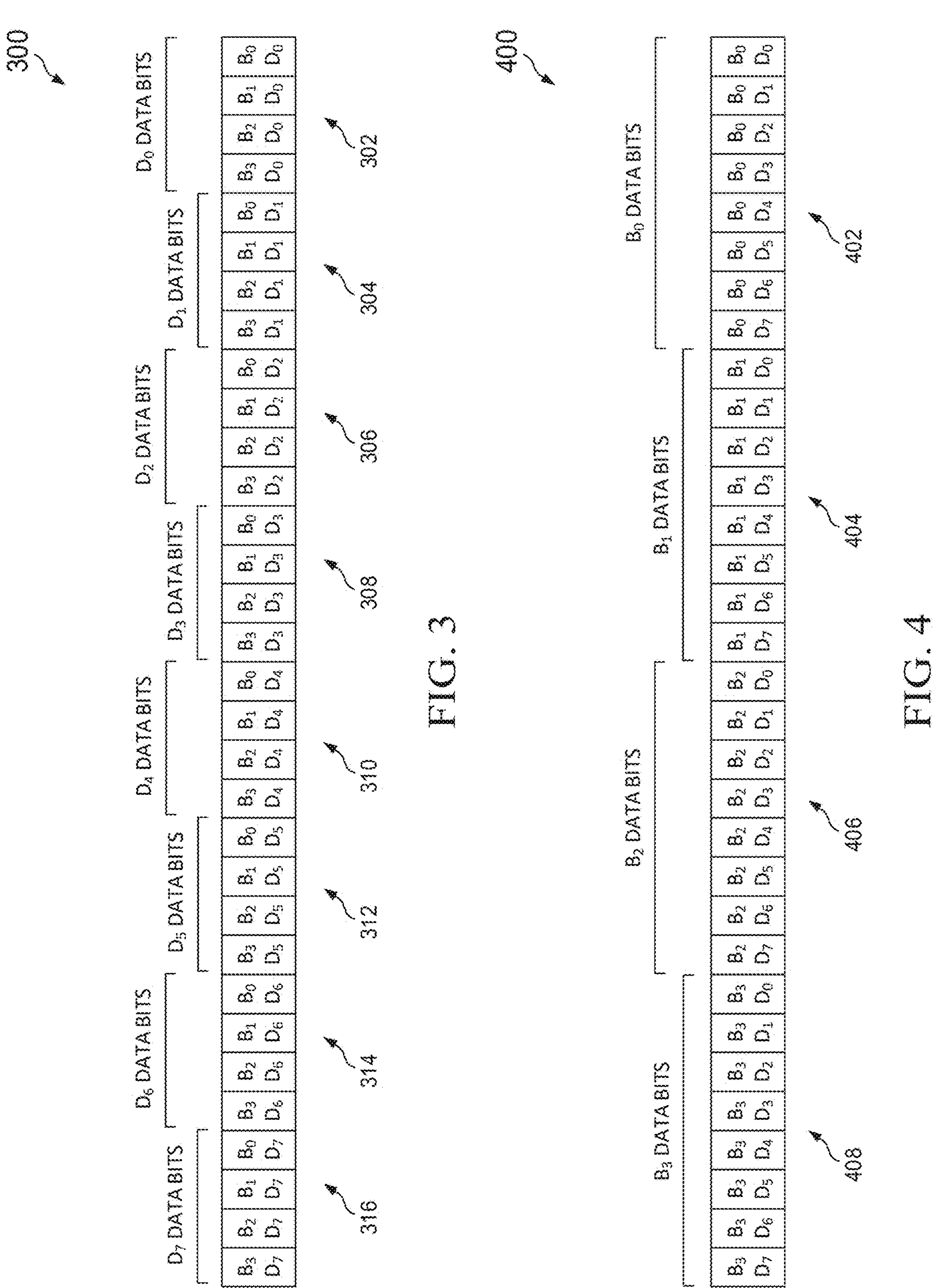
FIG. 3 is the rearranged word after the word from FIG. 2 has undergone bus remapping.
FIG. 4 is a word at the memory controller after inverse remapping through the bus.

The representation of word 200 in the memory controller write bus illustrates the original ordering of bits before any remapping occurs. FIG. 3 demonstrates how these bits are rearranged through the bus remapping process, a feature of the memory system 100 described in this disclosure.

FIG. 3 illustrates the rearranged word 300 after the word 200 from FIG. 2 has undergone bus remapping. The remapping process provides a fault-tolerant memory system demonstrating how the data bits can be arranged in memory 104 to enhance resilience against multi-bit errors, such as in wide-word volatile memories used in safety-critical applications.

As with FIG. 2, the representation of word 300 does not include parity bits. In a complete system, parity bits can be integrated into the remapped structure, following a similar distribution pattern to enhance error detection capabilities further.

Word 300 maintains the overall structure of the first byte $B_0$ 202, the second byte $B_1$ 204, the third byte $B_2$ 206, and the fourth byte $B_3$ 208, each containing 8 bits (i.e., $D_0$ through $D_7$). However, the arrangement of these bits within word 300 is altered with respect to word 200. The remapping follows a pattern that spreads data bits across the word width, implementing a form of bit interleaving that the memory compiler may not natively support for wide-word structures.

FIG. 3 illustrates an example of remapping using a multiplexing factor of four for interleaving the data bits in a 32-bit word. In this arrangement, bits from the same original byte are distributed in the remapped word in every fourth position. As a result, bits adjacent in word 200 are separated by three other bits in the remapped configuration. For example, the data bits from the first byte $B_0$ 202 are distributed every fourth position across word 300 rather than grouped as in word 200 of FIG. 2.

The remapping process can be observed by following the bit positions from left to right. For example, the first four bits 316 of the remapped word 300 represent the most significant bit (i.e., $D_7$) from each of the four original bytes. The pattern continues with the next set of four bits 314 representing the seventh bit (i.e., $D_6$) from each byte, and so on.

In embodiments, the distribution of bits follows a predetermined pattern throughout word 300. For example, all bits from the first byte $B_0$ 202 of word 200 are positioned every fourth bit in word 300. The arrangement is repeated for bits from the second byte $B_1$ 204, the third byte $B_2$ 206, and the fourth byte $B_3$ 208. The least significant bits (i.e., $D_0$) from each byte are positioned in the last four bits 302 of word 300.

In embodiments, the remapping pattern applies to all four bytes, with each bit evenly distributed throughout the word 300. Each byte's least significant bits (i.e., $D_0$) are positioned first, followed by progressively more significant bits (i.e., $D_1$, $D_2$, etc.) at regular intervals.

The remapping process enhances fault tolerance through spatial separation of related bits. In the original arrangement of word 200, a single physical event, such as a radiation strike affecting adjacent bits, can corrupt multiple bits within the same byte. In the remapped arrangement of word 300, bits from the same byte are separated by three other bits. The separation means that a single localized event is much less likely to affect multiple bits from the same byte or group of dependent bits, thereby improving the system's resilience to localized faults.

Further, the proposed remapping for storing bits in memory 104 from memory controller 102 improves the effectiveness of parity protection. Assuming one parity bit per byte, in the original arrangement, a two-bit error within a byte would go undetected by parity checking. In the remapped arrangement, for a two-bit error to go undetected, it must affect two specific bits separated by at least three other bits. The probability of this occurring due to a single physical event is significantly lower, thus enhancing the system's overall error detection capability.

The proposed rearrangement also enhances resilience to burst errors, a common failure mode in memory systems. Burst errors affect a series of consecutive bits. A burst error can corrupt the original arrangement's entire or multiple bytes. In the remapped arrangement, a burst error of up to 4 bits would affect at most one bit from each original byte. The limitation of impact makes burst errors more detectable and less likely to cause undetected data corruption.

While FIG. 3 illustrates a 32-bit word with a multiplexing factor of four, the same principle can be applied to larger word sizes, such as 128-bit or 256-bit words and different multiplexing factors. In larger words, the multiplexing factor can be increased, further spreading out related bits and enhancing fault tolerance.

While demonstrated here with a 32-bit word and a multiplexing factor of four, the proposed remapping becomes even more powerful when applied to larger word sizes. For example, in a 128-bit word, bits from the same original byte could be separated by 15 other bits, reducing the likelihood of multi-bit errors within a single byte. The approach's scalability makes it valuable for wide-word memories used in high-performance, safety-critical applications.

In embodiments, the remapping technique complements rather than replaces existing error detection methods like parity checking. It can effectively extend the capabilities of simple parity checking to provide protection levels that approach those of more complex ECC schemes without the associated overhead. The compatibility allows for enhanced fault tolerance without significantly changing existing error detection circuitry.

Further, the remapping can be customized based on known vulnerability patterns of specific memory technologies. Different memory technologies may have specific vulnerability patterns, such as a tendency for column-wise failures. The system can provide targeted protection against a given memory technology's most likely failure modes by tailoring the remapping to these known patterns.

By implementing the remapping technique, the memory system can significantly increase its resilience to various types of faults, particularly multi-bit errors, without requiring changes to the underlying memory structure or introducing complex error correction circuitry. This makes it an efficient and effective approach for enhancing fault tolerance in wide-word memories used in safety-critical applications, such as automotive systems, industrial control equipment, or aerospace technologies where data integrity is paramount.

FIG. 4 illustrates a word 400 at the memory controller 102 after inverse remapping through the bus 106. The word 400 illustrates how the data is restored to its original arrangement, mirroring the organization shown in FIG. 2. The word 400 is again arranged into four bytes (i.e., $B_0$, $B_1$, $B_2$, and $B_3$), each containing 8 bits (i.e., $D_0$ through $D_7$).

In the restored configuration, the bits are reordered from their interleaved state in memory 104 to their original, logical sequence. The least significant byte (i.e., $B_0$) is positioned on the right side of the word 400, with its bits arranged from least significant (i.e., $D_0$) to most significant (i.e., $D_7$). The pattern continues through the remaining bytes (i.e., $B_1$, $B_2$, and $B_3$), with the third byte (i.e., $B_3$) representing the most significant byte on the left side of the word 400.

The remapped arrangement shown in FIG. 3 represents how data can be stored in the memory array. When reading from memory 104, an inverse remapping process can be applied to restore the original bit order, as shown in FIG. 4, allowing the memory controller 102 and other system components to interpret the data correctly.

FIG. 4 demonstrates the final stage of the remapping process, where the data is returned to its original format for use by the memory controller 102 and other system components. Restoring the original bit order allows the system to interpret and process data properly.

While the example in FIG. 4 shows a 32-bit word, the same principle of inverse remapping applies to larger word sizes, such as 128-bit or 256-bit words. In those cases, the number of bytes and bits would scale accordingly, but the concept of restoring the original order remains consistent.

As with FIG. 2 and FIG. 3, the parity bits are not explicitly shown in this representation. In a complete system, parity bits can be processed alongside the data bits, potentially undergoing an inverse remapping to restore their original positions relative to the data they protect.

The inverse remapping process illustrated here advantageously improves the fault tolerance of memory system 100. It allows memory system 100 to benefit from the enhanced error resilience provided by the interleaved storage format while presenting data in a standard format to the rest of the system. The approach enables seamless integration of the fault-tolerance mechanism without requiring changes to other system components that expect data in a conventional format.

While FIGS. 2-4 illustrate a 32-bit word example without showing parity bits, parity bit reduction can still be applied and benefit larger word sizes. In a traditional implementation, a 32-bit word might use 4 parity bits (1 per byte) or even 8 parity bits (1 per nibble) for error detection.

With the remapping technique illustrated in FIGS. 2-4, reducing the number of parity bits is possible while maintaining robust error detection capabilities. For example, the 32-bit word can use just 2 parity bits for the entire 32-bit word. Although the reduction is not as dramatic as in larger word sizes, it demonstrates the principle of the technique.

The main advantage of parity bit reduction becomes more apparent with larger word sizes, such as 128-bit or 256-bit words. In these cases, the reduction from 1 parity bit per byte to 1 parity bit per half-word (32 bits) results in significant savings regarding memory overhead and data transfer bandwidth.

As word sizes in memory systems continue to increase to meet the demands of high-performance, safety-critical applications, the parity bit reduction enabled by the remapping technique rises in value. It allows for maintaining strong error detection capabilities while minimizing the overhead associated with error-checking bits.

The parity-based approach with remapping provides exceptional fault coverage. In various scenarios and under different fault models, the technique offers greater than 99% fault coverage. The high level of coverage can be particularly advantageous for safety-critical applications, where even small fault tolerance improvements can substantially impact overall system reliability.

Figure 5:
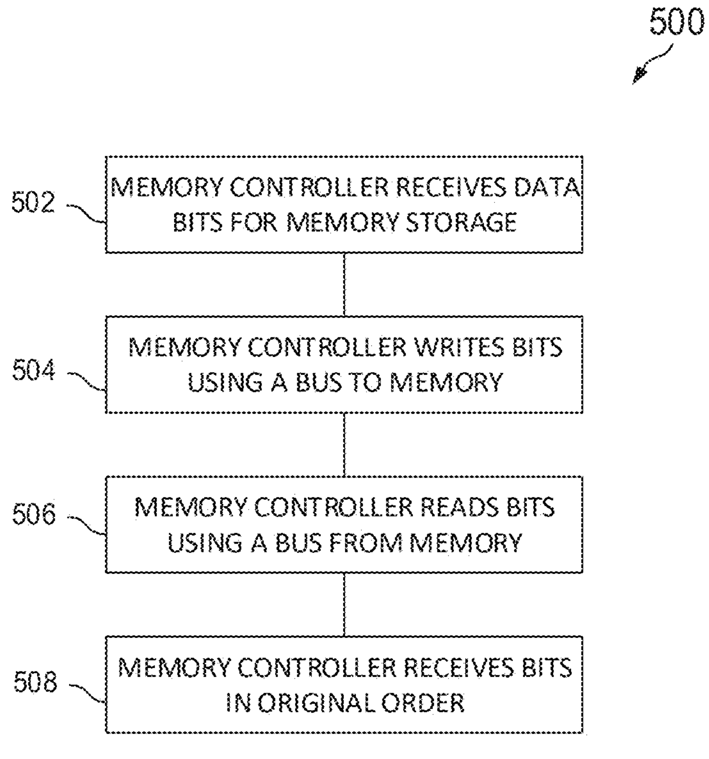
FIG. 5 is an embodiment method for operating a memory system with enhanced fault tolerance through bus remapping.

FIG. 5 illustrates an embodiment method 500 for operating a memory system with enhanced fault tolerance through bus remapping. It is noted that all steps outlined in the flow chart of method 500 are not necessarily required and can be optional. Further, changes to the arrangement of the steps, removal of one or more steps and path connections, and addition of steps and path connections are similarly contemplated.

At step 502, a memory controller (e.g., the memory controller 102) receives data bits for a word to be stored in memory (e.g., memory 104). At this step, the memory controller optionally generates parity bits for the data word. Generating parity bits can be beneficial as it provides an additional layer of error detection. Combined with the remapping technique, it enhances the system's ability to detect and potentially correct errors, which can be particularly advantageous in safety-critical applications.

Parity bit generation's optional nature allows for system design flexibility, balancing error detection capabilities with memory overhead based on specific application requirements.

It is important to note that while parity bit generation is described as optional in the context of general memory system functionality, it is advantageous for effectively implementing the remapping technique discussed in this disclosure. The remapping technique relies on parity or similar fault detection mechanisms to identify and address errors, significantly enhancing the robustness of the memory system against various types of faults.

Therefore, parity bit generation can be considered an integral component. The term "optional" in the preceding paragraphs refers solely to the broader context of memory system design, where parity might not be required for basic functionality but is advantageous for the advanced error detection and correction capabilities provided by the remapping technique described herein.

At step 504, the memory controller writes the data bits and, if generated, the parity bits to the memory via a bus (e.g., the bus 106). In embodiments, the memory controller operates as if writing to a standard memory configuration, remaining agnostic to any remapping during the writing process. In embodiments, the remapping occurs within the bus, where the wiring physically rearranges the bits into the desired structure before reaching the memory. In this embodiment, the remapping is transparent to the memory controller, allowing for seamless integration with existing designs. The remapped bits are stored in the memory according to the new arrangement determined by the bus.

In embodiments, the memory controller may actively participate in the rearrangement process. In these cases, the memory controller can rearrange the bits and utilize logic circuits implemented in the bus to store the data and the optional parity bits in the memory in a desired and configurable manner. The approach allows for more flexibility in the remapping scheme, enabling dynamic adjustments based on system requirements or detected error patterns.

In embodiments, mapping the data bits and the optional parity bits in the memory during the write sequence follows a pattern based on a configurable or predetermined multiplexing factor. The multiplexing factor determines the spatial separation of related bits within the memory array, enhancing protection against multi-bit errors.

The arrangement is not limited to the multiplexing factor scheme, as other arrangements can improve the memory's resiliency. For instance, a cyclic shifting approach can be employed, where each byte or word is cyclically shifted by a different amount, spreading related bits across the memory word. Alternatively, an interleaved block mapping strategy might be used, interleaving blocks of bits instead of individual bits, which can offer protection against burst errors.

Other potential arrangements include prime number spacing, where related bits are spaced apart by prime number intervals, reducing the likelihood of periodic error patterns affecting multiple related bits. A pseudo-random distribution can also be implemented, using a predetermined pseudo-random pattern to distribute bits, offering protection against a wider variety of error patterns. Some systems might employ an error-history adaptive mapping, dynamically adjusting the bit mapping based on the history of detected errors and adapting to observed vulnerability patterns.

Another potential approach involves remapping the data bits for the purpose of creating parity bits, rather than remapping the data bits for storage in memory. In this scheme, the memory controller can apply various remapping techniques to the original data bits before generating the parity bits. These remapping techniques can include any previously mentioned schemes, such as the multiplexing factor, cyclic shifting, interleaved block mapping, prime number spacing, or pseudo-random distribution.

After the remapping, the memory controller 102 generates parity bits based on the remapped data. The original, unremapped data bits are then stored in memory along with the parity bits generated from the remapped version. This method integrates remapping into the error detection process without altering the physical arrangement of data in memory.

By creating parity bits from remapped data, this approach can potentially enhance the effectiveness of error detection, particularly for multi-bit errors, while maintaining compatibility with existing memory structures and read/write processes. The specific remapping scheme used for parity generation can be selected or dynamically adjusted based on the system's requirements and observed error patterns, allowing for flexible and potentially more robust error detection capabilities.

The alternative arrangements, like the multiplexing factor scheme, aim to improve memory resilience by dispersing related bits and reducing the likelihood of multi-bit errors affecting critical data. The specific arrangement can be chosen or dynamically adjusted based on the system's requirements and observed error patterns. Regardless of the specific implementation or arrangement selected, the remapped bits are stored in the memory according to the new arrangement determined by the bus wiring or the memory controller and bus logic combination. The remapping enhances protection against multi-bit errors by increasing the spatial separation of related bits within the memory array.

When retrieving the data, step 506 initiates the read process. The remapped data and parity bits are read from the memory array and transmitted back through the bus to the memory controller. This step includes the inverse remapping process, which can occur automatically due to the physical wiring of the bus in one or more embodiments. As the bits travel through the bus, they are restored to their original order before reaching the memory controller. This process is entirely transparent to the memory and the memory controller, with the bus handling all aspects of the remapping and inverse remapping.

In other embodiments, the memory controller can be more active in reordering. In these cases, the memory controller receives the data and the optional parity bits in their remapped arrangement. It utilizes logic circuits implemented in the bus to reorder the data and the optional parity bits from the memory arrangement back to the original arrangement of the word. This approach allows for more flexibility in the remapping scheme, enabling dynamic adjustments or more complex remapping strategies that can be reversed through computational means rather than relying solely on fixed wiring.

The reordering process implemented in step 508 is precisely the inverse of the scheme selected when the data is initially rearranged for storage in the memory. Whether the original arrangement used a multiplexing factor, cyclic shifting, interleaved block mapping, prime number spacing, pseudo-random distribution, or any other custom arrangement, the read process applies the exact inverse of that operation. This ensures that the data is faithfully reconstructed to its original form.

The system can record the arrangement scheme used for writing through fixed hardware design or configurable settings to guarantee that the correct inverse operation is applied during reading. The symmetry between the write and read processes maintains data integrity and allows the memory controller to interact with the data as if no remapping had occurred.

Regardless of the specific implementation, the result of step 508 is that the memory controller receives the data bits (and parity bits, if used) in their original, pre-remapped order. This allows the memory controller to perform standard operations such as parity checking without being aware of any remapping during the storage process. This allows the memory controller 102 to perform certain standard operations without being affected by the remapping that occurred during the storage process. These standard operations can include transaction protocol checks and upstream data transportation. It's important to note that some operations, particularly those related to error detection and correction like parity checking, may be integrated with the remapping process and thus would be aware of and account for the remapping scheme.

Finally, in step 508, the memory controller receives the data bits (and parity bits, if used) in their original, pre-remapped order. Unaware of any remapping, the memory controller can perform standard operations such as parity checking to detect any errors that may have occurred during storage or transmission.

Figure 6:
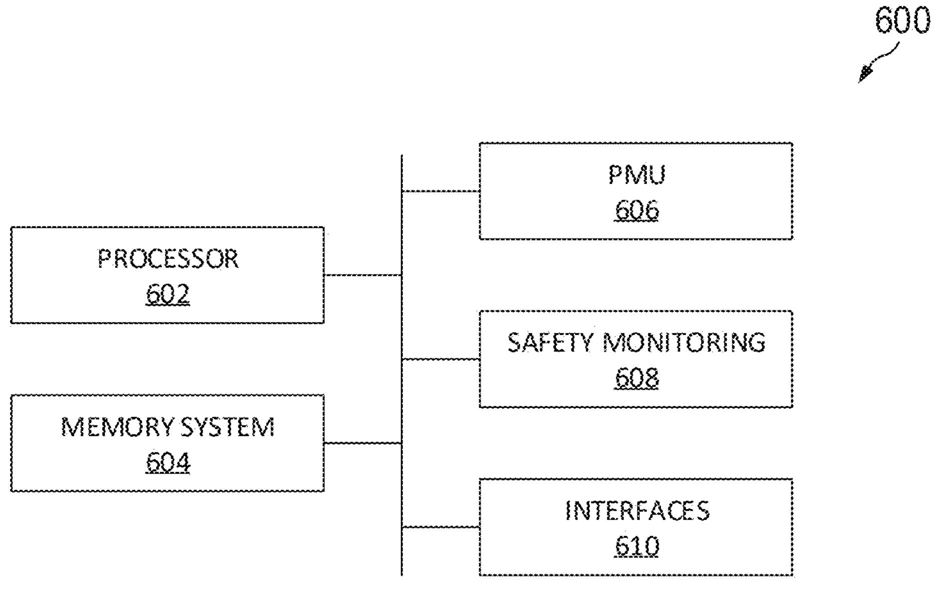
FIG. 6 is a block diagram of an embodiment system, tailored for use in safety-critical applications such as automotive or industrial control units.

FIG. 6 illustrates a block diagram of an embodiment system 600, tailored for use in safety-critical applications such as automotive or industrial control units. System 600 includes a processor 602, a memory system 604, a power management unit 606, a safety monitoring system 608, and multiple interfaces 610, which may (or may not) be arranged as shown. Although FIG. 6 shows one of each component, the number of components is not limiting, and greater numbers are similarly contemplated in other embodiments, particularly for redundancy in safety-critical systems.

System 600 may include additional components not shown, such as long-term storage (e.g., non-volatile memory, etc.), a bus system (i.e., control, status, data, etc. bus) to couple the various components of the device, security and encryption modules (e.g., trusted platform modules (TPM), etc.), or the like.

In embodiments, system 600 is designed for safety-critical applications in various domains. It can be implemented as an Electronic Control Unit (ECU) in automotive systems, managing engine control, brake systems, or advanced driver assistance systems (ADAS). In industrial settings, system 600 may serve as a Programmable Logic Controller (PLC) for process control or as a safety instrumented system (SIS) for critical industrial operations. It could be a flight control computer or an avionics system in aerospace applications. System 600 might be employed in life-support equipment or diagnostic imaging systems for medical devices. In nuclear power plants, it could be part of the reactor's electronic system. These implementations all share the common requirement for high reliability and fault tolerance in environments where system failure could have severe consequences.

Processor 602 may be any component or collection of components adapted to perform computations or other processing-related tasks with specific features for safety-critical operations. In embodiments, processor 602 is a safety-certified microcontroller or application processor, potentially with built-in redundancy or error-checking capabilities.

Memory system 604 can be implemented as memory system 100, incorporating the fault-tolerant bus remapping technique described earlier. It may be any component or collection of components adapted to store programming or instructions for execution by processor 602, with enhanced error detection and correction capabilities. In an embodiment, memory system 604 includes a non-transitory computer-readable medium optimized for safety-critical applications.

Power management unit 606 provides a regulated and monitored power source for operating the system 600. It may include voltage monitoring, brownout detection, and safe power-down sequences in safety-critical applications.

Safety monitoring system 608 is typically employed in safety-critical applications. It continuously monitors the system's operation, checks for anomalies, and can initiate safe states or shutdown procedures if critical errors are detected. This system works with the memory system 604 to ensure overall system integrity.

Interfaces 610 may include components allowing the processor 602 to communicate with other devices/components or a user. In automotive applications, this might include CAN bus interfaces, FlexRay, or Automotive Ethernet. Industrial control units could include fieldbus protocols, industrial Ethernet, or process control interfaces. These interfaces are designed to meet stringent safety and reliability standards specific to their application domains.

Integrating the memory system 604 with the safety monitoring system 608 and other safety-optimized components creates a robust architecture suitable for deployment in environments where system failure could lead to severe consequences, such as in vehicle control systems or critical industrial processes.

Figures 7, 8:
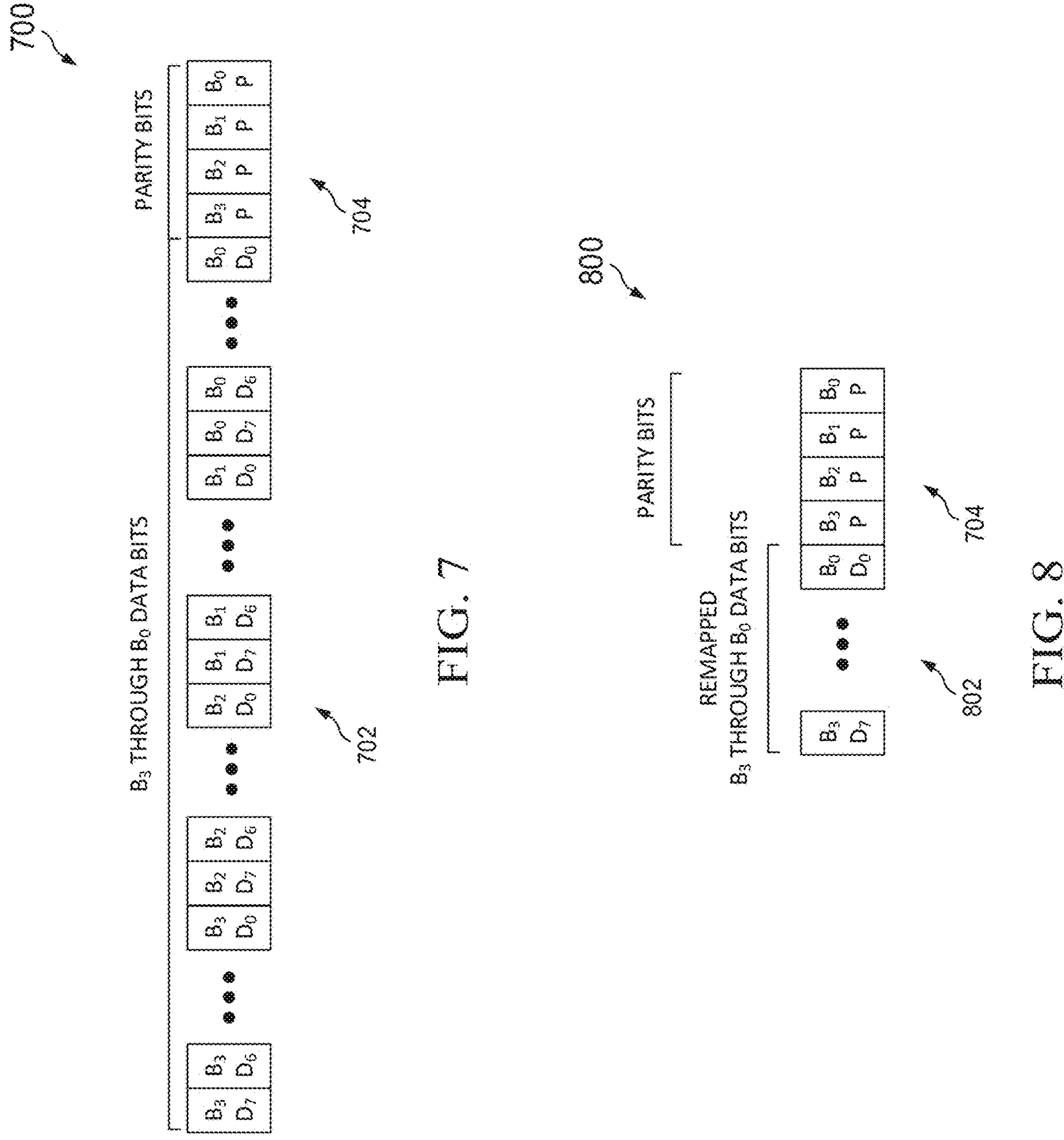
FIG. 7 is the arrangement of a word in a memory controller write bus before remapping occurs.
FIG. 8 is a remapped word after the remapping process has been applied to the data bits, while the parity bits remain in their original positions.

FIG. 7 illustrates the arrangement of a word 700 in a memory controller write bus before remapping occurs. Word 700 is a 36-bit word organized into data bits 702 and parity bits 704, which may (or may not) be arranged as shown. The arrangement shown in FIG. 7 represents the generic representation of the state of the word before any remapping occurs.

The data bits 702 can represent the word 200 in FIG. 2, which includes four bytes (i.e., $B_0$, $B_1$, $B_2$, and $B_3$), each containing 8 bits (i.e., $D_0$ through $D_7$). The parity bits 704 (i.e., $B_3P$, $B_2P$, $B_1P$, and $B_0P$) are positioned at the end of the word 700. This arrangement allows for error detection while maintaining a consistent structure for the data bits. In embodiments of the disclosure, the memory controller 102 can generate the parity bits 704 before transmitting the word 700 to the memory 104.

While FIG. 7 depicts a 36-bit word (32 data bits and 4 parity bits), the concept can be scaled to larger word sizes, such as 64, 128, or 256 data bits, by extending the pattern and adding more parity bits as needed. The remapping scheme can be adjusted based on system requirements and balancing factors such as error protection and implementation complexity.

FIG. 8 illustrates a remapped word 800 after the remapping process has been applied to the data bits 702, while the parity bits 704 remain in their original positions. The word 800 is organized into the remapped data bits 802 and the parity bits 704, which may (or may not) be arranged as shown.

In the remapped data bits 802, the data bits are interleaved according to a predetermined remapping scheme. In embodiments, the remapped data bits 802 follow the arrangement of the data bits shown in FIG. 3. However, it should be appreciated that the remapping of the data bits by the bus 106 or the memory controller 102 is not limited to the multiplexing factor scheme and other schemes, such as the cyclic shifting approach, the interleaved block mapping strategy, the prime number spacing approach, the pseudo-random distribution, or the error-history adaptive mapping, may be used for interleaving the data bits when storing the data bits in memory 104.

The parity bits 704 can remain unchanged from their original arrangement in word 700. These parity bits can be positioned at the end of the word, maintaining their original order and position.

This arrangement demonstrates the remapping process in embodiments of the disclosure: while the data bits 802 are reorganized to enhance fault tolerance, the parity bits 704 can remain in their original positions.

Keeping the parity bits in their original positions can simplify the parity-checking process. The memory controller 102 can easily locate and access the parity bits 704 without applying inverse mapping by bus 106. This arrangement can reduce the complexity of the remapping circuitry, as it only needs to handle the data bits. This may lead to more efficient implementation and potentially lower power consumption.

Maintaining the parity bits 704 in a fixed position can facilitate easier error detection and correction processes, as the relationship between the parity bits 704 and their corresponding data bits remains consistent regardless of the data bit remapping scheme.

The remapping approach illustrated in FIG. 8 can be scaled to larger word sizes by extending the remapping pattern for the data bits while keeping the parity bits grouped at the end of the word. This scalability allows the technique to be applied to various memory configurations and word sizes.

By remapping the data bits while keeping the parity bits in place, the arrangement can enhance the memory system's fault tolerance without increasing the complexity of parity operations. The approach may improve reliability in various applications, including safety-critical requirements while maintaining efficient error detection capabilities.

Figure 9:
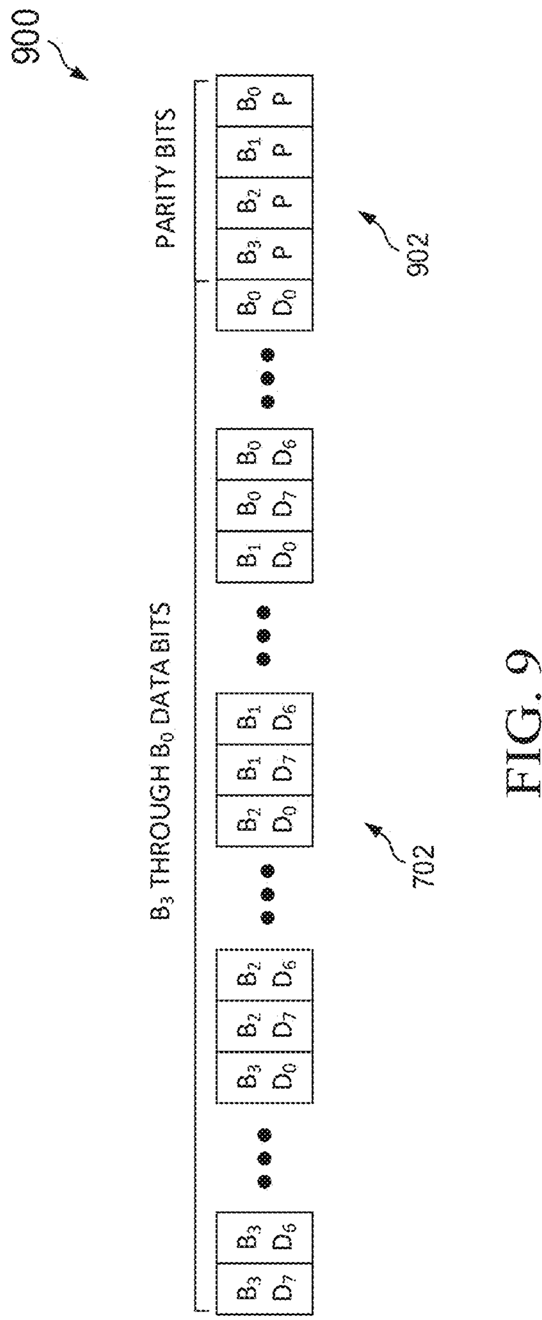
FIG. 9 is a word arrangement that represents a data storage scheme in accordance with aspects of the disclosure.

FIG. 9 illustrates a word arrangement 900 that represents a data storage scheme in accordance with aspects of the disclosure. The word arrangement 900 includes data bits 702 and parity bits 902, which may (or may not) be arranged as shown.

The data bits 702 represent the original, unremapped data bits that as stored in memory 104. The parity bits 902 include individual parity bits generated by, for example, memory controller 102 based on a remapped version of the data bits 702. In the illustrated arrangement, the parity bits 902 are stored alongside the original data bits 702 in memory.

In embodiments, memory controller 102 receives the original data bits 702. The memory controller is configured to remap the data bits 702 according to a predetermined scheme. Such schemes may include but are not limited to, multiplexing factor, cyclic shifting, interleaved block mapping, prime number spacing, or pseudo-random distribution. Using the remapped version of the data bits 702, the parity generator circuit 112 of memory controller 102 can generate the parity bits 902.

After the generation of the parity bits 902, the original data bits 702 are stored in memory 104. The generated parity bits 902 can be stored alongside the data bits 702. The approach integrates remapping into the error detection process without altering the physical arrangement of data bits 702 in memory 104 through, for example, bus 106.

By creating parity bits 902 from remapped data, this approach can enhance the effectiveness of error detection, particularly for multi-bit errors, while maintaining compatibility with existing memory structures and read/write processes. The specific remapping scheme used for parity generation can be selected or dynamically adjusted based on system requirements and observed error patterns. This flexibility allows for potentially more robust error detection capabilities in various system configurations.

In embodiments, the disclosed fault-tolerant memory system and associated method of operation provide a robust solution for enhancing data integrity in wide-word volatile memories, particularly in safety-critical applications.

By implementing a bus remapping technique, the system significantly improves resilience against multi-bit errors without requiring substantial changes to existing memory structures or introducing significant overhead.

The approach can benefit automotive, industrial, aerospace, and medical applications where system reliability is paramount. The flexibility of the remapping scheme, combined with its compatibility with standard error detection methods like parity checking, allows for easy integration into various system designs.

Moreover, the potential for reducing the number of parity bits in larger word sizes offers additional benefits in terms of memory efficiency and reduced chip area. With its ability to provide greater than 99% fault coverage under various fault models, embodiments of the disclosure represent a significant advancement in memory system design for safety-critical applications.

As electronic systems continue to play increasingly crucial roles in areas where failure is not an option, the importance of such fault-tolerant designs cannot be overstated. This technology thus advantageously contributes to developing more reliable, efficient, and safer electronic systems across a wide range of critical applications.

A first aspect relates to a method for operating a memory system. The method comprising receiving, at a memory controller, data bits for a word to be stored in a memory; remapping the data bits according to a predetermined remapping scheme as the data bits are transmitted from the memory controller to the memory via a bus; storing the remapped data bits in the memory; reading the remapped data bits from the memory via the bus; and inverse remapping the data bits according to an inverse of the predetermined remapping scheme, as the data bits are transmitted from the memory to the memory controller via the bus, to restore the original order of the data bits.

In a first implementation form of the method, according to the first aspect as such, the predetermined remapping scheme comprises one of a multiplexing factor scheme, a cyclic shifting approach, an interleaved block mapping strategy, a prime number spacing approach, a pseudo-random distribution, or an error-history adaptive mapping.

In a second implementation form of the method, according to the first aspect as such or any preceding implementation form of the first aspect, the method further includes generating parity bits for the data bits; and remapping the parity bits along with the data bits according to the predetermined remapping scheme.

In a third implementation form of the method, according to the first aspect as such or any preceding implementation form of the first aspect, the word has a size of 32 bits, 64 bits, 128 bits, or 256 bits, and wherein the predetermined remapping scheme is scalable to accommodate increasing word sizes.

In a fourth implementation form of the method, according to the first aspect as such or any preceding implementation form of the first aspect, the remapping of the data bits enhances error detection capabilities by spatially separating related bits within the word.

In a fifth implementation form of the method, according to the first aspect as such or any preceding implementation form of the first aspect, the remapping and inverse remapping occurs without introducing additional clock cycles, thereby maintaining memory system performance.

In a sixth implementation form of the method, according to the first aspect as such or any preceding implementation form of the first aspect, the predetermined remapping scheme is implemented using hardwired connections in the bus, and wherein the hardwired connections physically rearrange the data bits according to the predetermined remapping scheme during transmission.

A second aspect relates to a memory system comprising a memory controller; a memory; and a bus coupling the memory controller to the memory, wherein the bus is configured to: remap data bits according to a predetermined remapping scheme as the data bits are transmitted from the memory controller to the memory, and inverse remap the data bits according to an inverse of the predetermined remapping scheme, as the data bits are transmitted from the memory to the memory controller, to restore the original order of the data bits.

In a first implementation form of the memory system, according to the second aspect as such, the predetermined remapping scheme comprises a multiplexing factor scheme that separates initially adjacent bits by a number of bit positions equal to a multiplexing factor of the multiplexing factor scheme.

In a second implementation form of the memory system, according to the second aspect as such or any preceding implementation form of the second aspect, the predetermined remapping scheme comprises a cyclic shifting approach where each byte or word is cyclically shifted by a different amount.

In a third implementation form of the memory system, according to the second aspect as such or any preceding implementation form of the second aspect, the predetermined remapping scheme comprises an interleaved block mapping strategy that interleaves blocks of bits.

In a fourth implementation form of the memory system, according to the second aspect as such or any preceding implementation form of the second aspect, the predetermined remapping scheme comprises a prime number spacing approach where related bits are spaced apart by prime number intervals.

In a fifth implementation form of the memory system, according to the second aspect as such or any preceding implementation form of the second aspect, the predetermined remapping scheme comprises a pseudo-random distribution using a predetermined pseudo-random pattern to distribute bits.

In a sixth implementation form of the memory system, according to the second aspect as such or any preceding implementation form of the second aspect, the bus comprises hardwired connections that physically rearrange the data bits according to the predetermined remapping scheme.

A third aspect relates to a method for operating a memory system, the method comprising receiving, at a memory controller, data bits for a word to be stored in a memory; remapping, by the memory controller, the data bits according to a predetermined remapping scheme to create remapped data bits; generating, by the memory controller, parity bits based on the remapped data bits; storing the original, unremapped data bits in the memory; and storing the generated parity bits in the memory.

In a first implementation form of the method, according to the third aspect as such, the predetermined remapping scheme comprises a multiplexing factor scheme that separates initially adjacent bits by a number of bit positions equal to a multiplexing factor of the multiplexing factor scheme.

In a second implementation form of the method, according to the third aspect as such or any preceding implementation form of the third aspect, the predetermined remapping scheme comprises a cyclic shifting approach where each byte or word is cyclically shifted by a different amount.

In a third implementation form of the method, according to the third aspect as such or any preceding implementation form of the third aspect, the predetermined remapping scheme comprises an interleaved block mapping strategy that interleaves blocks of bits.

In a fourth implementation form of the method, according to the third aspect as such or any preceding implementation form of the third aspect, the predetermined remapping scheme comprises a prime number spacing approach where related bits are spaced apart by prime number intervals.

In a fifth implementation form of the method, according to the third aspect as such or any preceding implementation form of the third aspect, the method is performed in a memory system configured for use in a safety-critical application selected from the group consisting of automotive systems, industrial control systems, aerospace systems, medical devices, and nuclear power control systems.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A method for operating a memory system, comprising:

receiving, at a memory controller, data bits for a word to be stored in a memory;

remapping the data bits according to a predetermined remapping scheme as the data bits are transmitted from the memory controller to the memory via a bus;

storing the remapped data bits in the memory;

reading the remapped data bits from the memory via the bus; and inverse remapping the data bits according to an inverse of the predetermined remapping scheme, as the data bits are transmitted from the memory to the memory controller via the bus, to restore the original order of the data bits, wherein the remapping and inverse remapping occurs without introducing additional clock cycles, thereby maintaining memory system performance.

2. The method of claim 1, wherein the predetermined remapping scheme comprises one of a multiplexing factor scheme, a cyclic shifting approach, an interleaved block mapping strategy, a prime number spacing approach, a pseudo-random distribution, or an error-history adaptive mapping.

3. The method of claim 1, further comprising:

generating parity bits for the data bits; and remapping the parity bits along with the data bits according to the predetermined remapping scheme.

4. The method of claim 1, wherein the word has a size of 32 bits, 64 bits, 128 bits, or 256 bits, and wherein the predetermined remapping scheme is scalable to accommodate increasing word sizes.

5. The method of claim 1, wherein the remapping of the data bits enhances error detection capabilities by spatially separating related bits within the word.

6. The method of claim 1, wherein the predetermined remapping scheme is implemented using hardwired connections in the bus, and wherein the hardwired connections physically rearrange the data bits according to the predetermined remapping scheme during transmission.

7. The method of claim 1, wherein the predetermined remapping scheme comprises a multiplexing factor scheme that separates initially adjacent bits by a number of bit positions equal to a multiplexing factor of the multiplexing factor scheme.

8. The method of claim 1, wherein the predetermined remapping scheme comprises a prime number spacing approach where related bits are spaced apart by prime number intervals.

9. A memory system comprising:

a memory controller;

a memory; and a bus coupling the memory controller to the memory, wherein the bus is configured to:

remap data bits according to a predetermined remapping scheme as the data bits are transmitted from the memory controller to the memory, and inverse remap the data bits according to an inverse of the predetermined remapping scheme, as the data bits are transmitted from the memory to the memory controller, to restore the original order of the data bits, wherein the predetermined remapping scheme comprises a multiplexing factor scheme that separates initially adjacent bits by a number of bit positions equal to a multiplexing factor of the multiplexing factor scheme.

10. The memory system of claim 9, wherein the predetermined remapping scheme comprises a cyclic shifting approach where each byte or word is cyclically shifted by a different amount.

11. The memory system of claim 9, wherein the predetermined remapping scheme comprises an interleaved block mapping strategy that interleaves blocks of bits.

12. The memory system of claim 9, wherein the predetermined remapping scheme comprises a prime number spacing approach where related bits are spaced apart by prime number intervals.

13. The memory system of claim 9, wherein the predetermined remapping scheme comprises a pseudo-random distribution using a predetermined pseudo-random pattern to distribute bits.

14. The memory system of claim 9, wherein the bus comprises hardwired connections that physically rearrange the data bits according to the predetermined remapping scheme.

15. A method for operating a memory system, the method comprising:

receiving, at a memory controller, data bits for a word to be stored in a memory;

remapping, by the memory controller, the data bits according to a predetermined remapping scheme to create remapped data bits, wherein the predetermined remapping scheme comprises a multiplexing factor scheme that separates initially adjacent bits by a number of bit positions equal to a multiplexing factor of the multiplexing factor scheme;

generating, by the memory controller, parity bits based on the remapped data bits;

storing the original, unremapped data bits in the memory; and storing the generated parity bits in the memory.

16. The method of claim 15, wherein the predetermined remapping scheme comprises a cyclic shifting approach where each byte or word is cyclically shifted by a different amount.

17. The method of claim 15, wherein the predetermined remapping scheme comprises an interleaved block mapping strategy that interleaves blocks of bits.

18. The method of claim 15, wherein the predetermined remapping scheme comprises a prime number spacing approach where related bits are spaced apart by prime number intervals.

19. The method of claim 15, wherein the method is performed in the memory system configured for use in a safety-critical application selected from the group consisting of automotive systems, industrial control systems, aerospace systems, medical devices, and nuclear power control systems.

20. The method of claim 15, wherein the remapping and inverse remapping occurs without introducing additional clock cycles, thereby maintaining memory system performance.

* * * * *